United States Patent [19]
Kaspaul

[11] Patent Number: 5,145,722
[45] Date of Patent: Sep. 8, 1992

[54] METHOD AND COMPOSITION FOR PROTECTING AND ENHANCING THE SOLDERABILITY OF METALLIC SURFACES

[75] Inventor: Alfred F. Kaspaul, Malibu, Calif.

[73] Assignee: Hughes Aircraft Company, Los Angeles, Calif.

[21] Appl. No.: 607,201

[22] Filed: Oct. 5, 1990

Related U.S. Application Data

[63] Continuation of Ser. No. 336,178, Apr. 11, 1989, Pat. No. 4,963,401.

[51] Int. Cl.$^5$ .............................................. B05D 3/02
[52] U.S. Cl. .................................. 427/388.1; 148/23; 148/25; 428/458; 428/462; 428/463; 428/464; 524/30
[58] Field of Search ................ 148/23, 25; 427/388.1; 428/458, 462, 463, 464; 524/30

[56] References Cited

U.S. PATENT DOCUMENTS

| | | | |
|---|---|---|---|
| 2,445,431 | 7/1948 | Hill | 29/148 |
| 2,715,616 | 8/1955 | MacIntosh | 260/31.2 |
| 2,816,357 | 12/1957 | Henning | 29/495 |
| 2,898,255 | 8/1959 | Thompson et al. | 148/23 |
| 3,035,339 | 5/1962 | Matter et al. | 29/495 |
| 3,305,406 | 2/1967 | Chmelik et al. | 148/23 |
| 3,728,783 | 4/1973 | Chartet | 29/495 |
| 3,791,027 | 2/1974 | Angelo et al. | 29/495 |
| 3,960,614 | 6/1976 | Stayner | 148/22 |
| 3,973,322 | 8/1976 | Boynton | 29/626 |
| 3,975,216 | 8/1976 | Stayner | 148/23 |
| 3,988,251 | 10/1976 | Shelby et al. | 252/63 |
| 3,988,283 | 10/1976 | Shelby et al. | 260/33.4 |
| 4,110,297 | 8/1978 | Shelby et al. | 260/33.4 |
| 4,115,342 | 9/1978 | Shelby et al. | 260/33.4 |
| 4,123,562 | 10/1978 | Chandross et al. | 427/58 |
| 4,216,035 | 8/1980 | Bakos et al. | 148/23 |
| 4,239,812 | 12/1980 | Boynton | 477/96 |
| 4,264,379 | 4/1981 | Caule | 148/6.15 |
| 4,429,457 | 2/1984 | Noguchi et al. | 29/840 |
| 4,452,650 | 6/1984 | Caule | 148/31.5 |
| 4,701,224 | 10/1987 | Zado | 148/25 X |
| 4,738,732 | 4/1988 | Anderson et al. | 148/23 |
| 4,762,573 | 8/1988 | Biverstedt | 148/25 X |

FOREIGN PATENT DOCUMENTS

| | | |
|---|---|---|
| 2828197 | 1/1980 | Fed. Rep. of Germany . |
| 3205315 | 8/1983 | Fed. Rep. of Germany . |
| 879907 | 3/1943 | France . |
| 621899 | 1/1987 | Japan . |
| 1050444 | 12/1966 | United Kingdom . |

OTHER PUBLICATIONS

*Xersin*, Multicore Publication.

*Primary Examiner*—Michael Lusignan
*Attorney, Agent, or Firm*—M. E. Lachman; W. J. Streeter; W. K. Denson-Low

[57] ABSTRACT

A method and composition for protecting and enhancing the solderability of a metallic surface. A mixture which includes a chosen protective material and a dicarboxylic acid fluxing agent is applied to the metallic surface to form a protective film or coating which also enhances the solderability of the metallic surface. The mixture is applied to the metallic surface as a solution having a solvent carrier which evaporates to leave the film. the film is heat activated at soldering temperatures to release the fluxing agent.

26 Claims, No Drawings

METHOD AND COMPOSITION FOR PROTECTING AND ENHANCING THE SOLDERABILITY OF METALLIC SURFACES

This is a continuation of application Ser. No. 07/336,178 filed Apr. 11, 1989, now U.S. Pat. No. 4,963,401.

BACKGROUND OF THE INVENTION

1. Field of the Invention

The present invention relates generally to the soldering of metallic surfaces. More specifically, the present invention relates to a coating or film which protects the metallic surface from contamination while being stored and provides at the same time for proper fluxing of the surface to enhance solderability at the solder temperature.

2. Description of Related Art

The manufacture of active circuit boards requires various soldering operations which must be carried out either manually, by some automated means, or both. A prerequisite for successful solder joints is proper wetting of all mating parts, component leads, or any other items to be fastened by the solder.

The solder operation requires proper fluxing agents, for without them, reliable electrical and/or mechanical connection may not be made even on apparently clean surfaces. Circuit boards and components, as received, are not necessarily clean and may carry various kinds of surface contaminants. Subsequent storage generally adds to these contaminants and does not improve upon solderability. As a result, some components may be adequately soldered when exposed to activated fluxing agents prior to soldering while some surfaces do not solder well even after treatment with activated flux.

For a reliable and repeatable soldering operation, especially in automated production lines, the following requirements are absolutely essential: (1) clean and solderable surfaces, (2) suitable solder alloys, (3) proper fluxing agents, (4) reproducible heat inputs and time of application, and (5) ease of flux/residue removal. Adequate solutions to all of these requirements have been met, except for the first requirement of a clean and solderable surface. For the most part, as long as the mating metallic surfaces are kept clean, reliable solder joints may be made. However, if the surface is not sufficiently clean, unreliable solder joints result. Further, currently used methods for cleaning surfaces to be soldered frequently use solvents such as halogenated hydrocarbons which have a negative impact on the environment.

The problems with imperfect solder joints or connections are generally due to contaminated surfaces which represent low energy sites. The adhesive forces acting on the metallic-solder interface must be larger than the cohesive forces of the corresponding solder. Without this, the solder will not wet the metal surface properly and in the end, a cosmetically acceptable but defective solder joint results. In order to prevent this problem, it is essential that the metallic surfaces be kept clean in the initial phase of the soldering operation. In addition, it is essential that high free-energy surfaces be present in the initial phase of the soldering operation so that subsequent chemical reaction will form a strong intermetallic bond between the metal and solder.

Examination of properly soldered joints shows that the solder has undergone a structural change as it bonds with the metal surfaces. There is a well defined intermetallic layer between the metallic surface and solder. For example, when using a lead-tin solder on a copper surface, this layer is a finely crystalline layer which comprises predominantly $Cu_6Sn_5$. Simultaneously with the growth of the inter-metallic layer, wetting is improved and the joining of the solder proceeds at a much faster rate. The initially fine crystalline intermetallic layer may become coarsely crystalline after a prolonged heat treatment, especially during rework, and may lead, in the end, to premature bond failure.

The mere introduction of molten solder into a narrow space between two metal surfaces does not necessarily result in the wetting of either surface. The ensuing alloying or formation of the intermetallic layer, which is a prerequisite of proper adhesion is often negated by surface contaminants. Molten solder, by itself, will not dissolve or displace the contaminants. It therefore is desirable to develop effective methods and means for the preservation and protection of high-energy metallic surfaces prior to and during the soldering operation. In addition, it is desirable to convert the low-energy (contaminated) surfaces to high-energy surfaces wherever possible to enhance solderability.

SUMMARY OF THE INVENTION

In accordance with the present invention, a surface coating or film is applied to metallic surfaces in order to protect the surface from contamination and also to enhance solderability by converting low-energy locations on the surface to high-energy surfaces for enhanced solderability utilizing heat-activation.

The present invention is based on the discovery that metallic surfaces can be protected and solderability enhanced by applying a film-forming mixture to the metallic surface to form a protective film. The mixture comprises a dicarboxylic acid fluxing agent and a chosen protective material which is relatively unreactive with the dicarboxylic acid and which forms a film with the dicarboxylic acid which, when subsequently exposed to soldering temperature, alters to release the dicarboxylic acid fluxing agent. The film protects the metallic surface from contamination prior to the soldering process and releases the fluxing agent when exposed to the soldering temperature to thus enhance the solderability of the metallic surface.

As a feature of the present invention, the mixture is a solution in which the protective material and dicarboxylic acid fluxing agent are dissolved in a suitable solvent. The solution is applied by spraying or dipping, with the film forming upon evaporation of the solvent. The resulting film adheres to the metallic surface and prevents contamination while at the same time acting as a fluxing agent to increase the energy of low-energy surface areas once heat-activated. As a result, the present protective film and the method for forming it provides an improved surface treatment for metallic surfaces which provides optimum protection of the surfaces and enhancement of solderability.

Additional features and attendant advantages of the present invention will become better understood when viewed in connection with the following detailed description of the invention.

DESCRIPTION OF THE PREFERRED EMBODIMENT

The present invention has wide applicability to protecting and enhancing the solderability of a variety of metallic surfaces. The invention is particularly well suited for treating the copper surfaces found in electronic circuit boards and assemblies. The present invention is also useful in treating other metallic surfaces such as steel, aluminum, or any metallic surfaces which must be joined by soldering.

The present invention may also be used with a wide variety of solder types. Although lead and lead alloy solders are the preferred type of solder, the film produced in accordance with the present invention has use in treating metal surfaces prior to soldering wherein any of the other well-known solder materials are to be used.

The films or coatings of the present invention are applied as a mixture to the metallic surface. The mixture includes a protective material and a dicarboxylic acid fluxing agent. The dicarboxylic acid fluxing agent must be a dicarboxylic acid or a derivative thereof. Suitable dicarboxylic acids include abietic acids, adipic acid, succinic acid, fumaric acid, maleic acid, glutaric acid, their alkyl derivatives, and their aromatic derivatives. It is advantageous to use such a dicarboxylic acid fluxing agent which, when exposed to soldering temperatures forms volatile by-products which leave no residue on the metallic surface. Thus, in accordance with the present invention no post-soldering cleaning step is required. This feature of the present invention is particularly significant since such cleaning to remove rosin flux as practised in the art typically uses chlorofluorocarbon materials which have an undesirable environmental impact. The protective material is essentially unreactive with the dicarboxylic acid fluxing agent and the metallic surface to be soldered and is capable of forming, in the presence of the fluxing agent, the film which protects the metallic surface from contamination in accordance with the present invention. Further, the protective agent must alter its form when subjected to soldering temperatures, for example, between 500° to 700° F. (260° to 371° C.), in such a manner that the fluxing agent is released. Thus, the heat at the soldering temperature activates the film to release the fluxing agent which enhances the solderability of the metallic surface. While not limiting the present invention to a particular theory of operation, it is believed that it is likely that the protective agent melts, although other forms of alteration may be possible. The particular protective material is chosen to be compatible with the particular dicarboxylic acid used and the particular soldering temperature used. Suitable protective materials include, but are not limited to, cellulose derivatives, vinyl copolymers, particularly vinyl chloride copolymers alone or in combination with vinyl acetate or vinyl alcohol; acrylic copolymers; polyether glycols; and thermoplastic elastomers such as styrene-butadiene. Suitable cellulosic protective materials include cellulose; cellulose esters such as cellulose acetate, cellulose nitrate, cellulose acetate butyrate, cellulose acetate propionate, etc.; cellulose ethers, such as ethyl cellulose, methyl cellulose, carboxy methyl cellulose, etc.; and other similar cellulose derivatives. Preferably, the cellulose is partially, but not totally esterified. Since the protective material protects the surface to be soldered from contamination, no pre-soldering cleaning step is required and thus the use of undesirable chemicals is avoided.

The exact ratio of fluxing agent to protective material will depend upon the particular application. Where it is desired to provide increased fluxing action or increase in the energy of low-energy surface sites, then the amount of fluxing agent should be increased. However, increases in the amount of fluxing agent tend to reduce the adherence of the film to the metallic substrate. Accordingly, it is preferred to reduce the amount of fluxing agent to as low a level as possible to provide the desired enhancement of solderability while still insuring that adherence of the film or coating to the metallic surface is maximized. For a mixture comprising adipic acid and cellulose acetate butyrate, a preferred ratio by weight of the protective material to the fluxing agent has been found to be about 1:1.

The above-described mixture may be applied to the metallic surface in a number of different ways. Preferably, the protective material is dissolved in a suitable solvent. For a cellulose derivative, suitable solvents are acetone, methyl ethyl ketone, other ketone solvents, or tetrahydrofuran. The fluxing agent is likewise dissolved separately in an appropriate solvent, such as methanol, isopropanol, or tetrahydrofuran. The two resulting solutions are then combined to form a coating solution in which the required ratio range of protective material and fluxing agent is provided. Alternatively, the fluxing agent and protective material may be dissolved in predetermined amounts in a common solvent or solvent blend.

A preferred coating solution is made by dissolving the protective material in a suitable solvent to form a protective material solution, and dissolving the dicarboxylic acid in a suitable solvent to provide a fluxing agent solution. These two solutions are then mixed together in equal proportions to form the final mixture which is preferably stored at room temperature for several hours, typically about twenty-four hours, prior to use. This storage time may be reduced if the storage temperature is raised slightly. However, it is preferred to store the mixture at room temperature to allow complete mixture of the solutions. The mixture may be diluted as required with an appropriate solvent or solvent blend in order to obtain the desired viscosity for applying the mixture, such as by dipping the substrate containing the metallic surface into the solution, to form a good quality coating.

After the setting period, the solution can be applied to the metallic surface by spraying or brushing, or the surface can be dipped into the solution. In a dipping process, the structure supporting the metallic surface, as well as the metallic surface itself becomes coated. Silk-screening of the solution onto the surface is also possible. The solution is quick drying and results in a tough and well-adherent thin film. The solution has an indefinite shelf life and one sample has been stored for over a year and a half without loss in effectiveness.

In order to increase the adherence of the film to the metallic surface, it was discovered that heating of the film to temperatures between 120° C. and 150° C. resulted in a more adherent film having an improved appearance. Other methods for achieving this improved adherence and appearance of the film include hot spraying of the solution at temperatures between 120° C. and 150° C. and/or preheating of the metallic surface within this temperature range.

The thickness of the coating formed in accordance with the present invention depends on the particular fluxing agent and protective material used and their relative proportions in the coating solution, as well as on the particular method used to apply the coating and the particular solder reflow technique used. The coating must be of sufficient thickness to provide an adequate amount of adipic acid to be released at soldering temperatures so that solderability is enhanced. In addition, the coating must be sufficiently thick to provide a barrier to contamination. On the other hand, if the coating is too thick, the protective material may char or produce contamination when subjected to soldering temperatures. The preferred thickness may be readily determined by experimentation. For the embodiment of the present invention described in the example herein, the preferred thickness was within the range of about 0.4 to 1.2 mils (0.001 to 0.003 cm).

Another method for preparing the mixture which is to be applied to the metallic surface involves melting the protective material and fluxing agent in the appropriate weight ratios to form a liquid having the appropriate composition. The liquid is cooled and the resulting solid is dissolved in a suitable solvent, such as acetone or methyl ethyl ketone. The resulting solution is then allowed to set for several hours at room temperature prior to application to the metallic substrate by any of the methods previously mentioned. The concentration of the protective material and fluxing agent in the solvent can be varied widely depending on the method of application used, such as spraying, brushing, dipping, etc. Preferably, the combined concentration of the protective material and fluxing agent in the solvent should be below about seventy percent. Higher concentrations result in the solution becoming exceedingly viscous and difficult to apply evenly in thin coatings.

The coating of the present invention is preferably applied to the metallic substrate as soon as possible after the metallic surface is formed, in order to avoid any possible contamination of the surface.

If desired, the coating can be softened after application by subjecting it to a suitable solvent such as a halocarbon or a ketone such as acetone. The softened coating is tacky and is especially useful in fabricating electronic circuit boards where it is desired to stick the various electronic components onto the board prior to soldering. The film should be treated with the additional solvents for only as long as it takes to make the surface softened and tacky. Unduly long exposure of the film to solvents may deteriorate the film.

An example of practice of the present invention is as follows:

EXAMPLE

Three mixtures were prepared in accordance with the present invention using as the protective agent cellulose acetate butyryl (CAB) having the following composition:

| Sample | Protective Agent Composition |
|--------|------------------------------|
| A | 28–31% acetyl, 16–19% butyryl |
| B | 2–3% acetyl, 50% butyryl |
| C | 28–31% acetyl, 16–19% butyryl |

Sample A comprised Eastman 171-15S, obtained from Eastman Kodak of Rochester, N.Y., and the above-noted composition is that reported by the manufacturer. Sample B comprised a material obtained from a chemical repackager and which is no longer commercially available, and the above-noted composition was determined by Fourier Transform Infrared Spectrometry. Sample C comprised Eastman 171-2, obtained from Eastman Kodak, but no longer available; and the above-noted composition is that reported by the manufacturer.

Formulation #1 was prepared from Solution A comprising 25 grams of Sample A in 250 ml tetrahydrofuran (THF) and Solution B comprising 25 grams of adipic acid in 250 ml THF. Solutions A and B were blended 1:1 by volume and diluted with sufficient THF to obtain the desired viscosity for dipping the test parts and obtaining a good coating. (The quality of the coating can be determined by visual observation.)

Formulation #2 was initially prepared from Solution A comprising 50 percent by weight Sample B in acetone and Solution B comprising 50 percent by weight adipic acid in isopropanol. Solutions A and B were blended 1:1 by volume and diluted with a sufficient amount of a 50/50 blend of acetone and isopropanol to form a good coating formulation. When attempts were made to replicate this experiment, it was found necessary to use a 50/50 blend of acetone and isopropanol to dissolve the adipic acid.

Formulation #3 was initially prepared from Solution A comprising 25 grams of Sample C in 250 ml acetone and Solution B comprising 25 grams of adipic acid in isopropanol. Solutions A and B were blended 1:1 by volume and diluted with a sufficient amount of a 50/50 blend of acetone and isopropanol to form a good coating formulation. When attempts were made to replicate this experiment, it was found necessary to use a 50/50 blend of acetone and isopropanol to dissolve the adipic acid.

Alternatively, the above-noted formulations may be prepared by adding equal weights of adipic acid and cellulose acetate butyrate to a solvent or solvent blend capable of dissolving both materials to form a solution having sufficient solids content, such as 8–16 percent, to form a good coating.

Test printed wiring boards and wires were dip coated with formulation #1, 2, or 3. As controls, a printed wiring board and a number of wires were dip coated with solder. The printed wiring boards comprised epoxy/glass or polyimide/glass, and the wires comprised copper or kovar.

Each of the test boards and wires and its corresponding control was subjected to the following series of tests:

a. Initial wetting balance solderability test on samples as received (As Rec'vd);
b. Storage under ambient conditions (AMB Store) for three months;
c. Second wetting balance solderability test;
d. Accelerated aging (Accel Age) of second set of test samples by exposure to 40°±2° C. and 90–95% relative humidity for 240 hours;
e. Third wetting balance solderability test;
f. Assemblies produced from samples from "b" and "d" storage conditions above;
g. Assemblies tested for burn-in according to MIL-STD-202 (Military Standard, Test Methods for Electronics and Electrical Components), Method 108 (300 hours at 125° C. with applied voltage).
h. Microsectioning of solder joints.

The wetting balance solderability test was performed as follows. A test sample was fitted with a force measurement device and submerged in molten solder. Changes in force (as detected by weight changes) on the sample indicated the solderability (weight or force increase due to wetting) or insolderability (weight or force decrease due to buoyancy). The amount of time in which these changes occurred also gave relative measurements of solderability, as discussed in further detail below.

A tin-lead solder, such as commercially available Sn-60, 62, or 63 was used, in accordance with Federal Specification, QQ-S-571 (Solder, Tin Alloy, Tin Lead Alloy, Lead Alloy).

The assemblies referred to in item "f" above were formed as follows. Solder coated wires were positioned onto pads on printed wiring boards which had been solder plated and fused. The wires were hand soldered (reflowed) using a 600° F. (316° C.) iron applied for approximately 5 seconds. The iron was removed and the joint between the wire and board was cooled undisturbed. For the control samples a small amount of Alpha 611 flux was brush coated onto the joint area prior to reflow. Alpha 611 flux is a mildly activated rosin (RMA) type flux and was used in accordance with MIL-F-14256 [Military Specification, Flux, Soldering, Liquid (Rosin Base)].

The solderability test data is presented in Table I. The time constant, expressed in seconds, indicates how quickly the solder wet the surface being tested. The smaller the number, the better the fluxing action and the faster the wetting occurred. The zero time, expressed in seconds, indicates how long it took the part being tested to achieve neutral buoyancy. In other words, the buoyancy of the immersed part has been overcome by wetting action between the molten solder and the part. In addition, the solder is perpendicular to the surface of the part. Non-wetting occurs when the angle between the part and the solder remains obtuse and the part remains buoyant in the solder. Positive wetting occurs when an acute angle is formed between the part and the solder that contacts the part. Further, the buoyancy of the part has been completely overcome and the solder is actually pulling on the part. The smaller the zero time number, the more solderable the part. The time to maximum force, expressed in seconds, indicates how long it took the solder to completely wet the part and exert its maximum pulling force upon it. The smaller the number, the better the solderability. The maximum force, expressed in millinewtons, indicates how much force the solder was able to exert upon the part. Parts that are more solderable will produce a higher maximum force value.

In terms of industry standards, the most significant data point is the zero time number. MIL-STD-883 (Military Standard, Test Methods and Procedures for Microelectronics), Method 2022.2, dated 29 May 1987, states that to pass this standard test, the zero time must be less than 0.59 seconds. As shown in Table I, all the tests on the as received and ambient storage condition parts passed. All the accelerated aged parts did not pass, and of the accelerated aged parts, only 7% of the control tested parts failed, while 100% of coating #1, 58% of coating #2, and 100% of coating #3 parts failed the zero time requirement. Due to the fact that all three coatings performed just as well as the control RMA flux tested parts during the as received and ambient storage conditions, the accelerated aging method must have affected the coatings of the present invention to some extent.

TABLE I

SOLDERABILITY TEST DATA

| | Time Const. (Sec) | Zero Time (Sec) | Time To Max (Sec) | Max Force (MN) |
|---|---|---|---|---|
| Control | | | | |
| As Rec'vd | 0.219 ± 0.0237 | 0.372 ± 0.0236 | 0.850 ± 0.0577 | 0.9875 ± 0.07680 |
| AMB Store | 0.323 ± 0.0459 | 0.455 ± 0.0363 | 1.03 ± 0.149 | 1.048 ± 0.06300 |
| Accel Age | 0.369 ± 0.0925 | 0.507 ± 0.0479 | 1.39 ± 0.186 | 0.9507 ± 0.1200 |
| Coating #1 | | | | |
| As Rec'vd | 0.139 ± 0.0301 | 0.375 ± 0.0191 | 0.750 ± 0.129 | 1.070 ± 0.1283 |
| AMB Store | 0.205 ± 0.0453 | 0.465 ± 0.0362 | 1.02 ± 0.178 | 1.104 ± 0.07760 |
| Accel Age | 0.549 ± 0.323 | 1.63 ± 1.52 | 1.66 ± 0.645 | 0.5386 ± 0.6135 |
| Coating #2 | | | | |
| As Rec'vd | 0.140 ± 0.0331 | 0.497 ± 0.0695 | 0.850 ± 0.0577 | 1.157 ± 0.04650 |
| AMB Store | 0.232 ± 0.0457 | 0.456 ± 0.0425 | 0.921 ± 0.131 | 1.109 ± 0.08240 |
| Accel Age | 0.246 ± 0.542 | 0.597 ± 0.0837 | 1.17 ± 0.181 | 1.028 ± 0.1044 |
| Coating #3 | | | | |
| As Rec'vd | 0.220 ± 0.133 | 0.400 ± 0.0140 | 0.875 ± 0.0500 | 1.145 ± 0.07900 |
| AMB Store | 0.245 ± 0.0825 | 0.442 ± 0.0520 | 0.900 ± 0.0471 | 1.091 ± 0.08960 |
| Accel Age | 0.373 ± 0.0724 | 0.680 ± 0.0745 | 1.36 ± 0.241 | 0.9920 ± 0.1858 |

In addition to wetting balance testing, all of the assemblies subjected to burn in were microsectioned across the solder joints for examination of the joint formation. The examinations focused on contact angles formed, and the presence or absence of voids and/or dewetting. All the contact angles were very small with most joints measuring between 5 and 20 degrees. These small contact angles indicate excellent wetting of solder to the part. Some voids were noted throughout all the parts. Typically one joint out of 12 would exhibit a very small void of approximately 1-2 microns in diameter. There was no evidence of dewetting on any of the microsections.

After solderability testing, the thickness of the coatings in accordance with the present invention was measured with vernier calipers and determined to be within the range of 0.4 to 1.2 mils (0.001 to 0.003 cm).

As can be seen from the above-described data, test samples having coatings #1, #2, or #3 in accordance with the present invention were generally more solderable than the control. The film in accordance with the present invention protects the solderable surface during storage and acts as a soldering flux during the solder joint formation process to thus enhance the solderability of the surface being soldered. Further, in accordance with the present invention, neither pre-soldering cleaning nor post-soldering cleaning is required and, thus, the use of solvents having a negative environmental impact is avoided.

The present invention has wide applicability to any situation requiring the joining of two metallic surfaces by soldering, including, but not limited to, the manufacture of printed circuit boards and the joining of pipes or gutters. The present invention is especially well adapted for use in automated production line procedures utilizing solder baths or bar soldering. The invention can be advantageously used in the soldering of electronic circuit boards and other situations where many solder joints are required to be soldered simultaneously. The present invention is also particularly well suited for soldering surface-mounted components, in which it is ordinarily difficult to clean and inspect the surface to be soldered due to the proximity of the component to the support or substrate.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A method for protecting and enhancing the solderability of a metallic surface comprising the steps of:
   (a) providing a mixture of an unsubstituted or alkyl-substituted aliphatic dicarboxylic acid fluxing agent and a chosen protective material which is unreactive with said dicarboxylic acid and which forms a film with said dicarboxylic acid that alters at a chosen soldering temperature within the range of 260° to 371° C. to release said dicarboxylic acid, wherein said chosen protective material is selected to from the group consisting of a cellulose ester, a vinyl chloride copolymer, an acrylic copolymer and a polyether glycol; and
   (b) forming a film from said mixture on said metallic surface wherein said film provides protection of said metallic surface from contamination during storage prior to a soldering process, and, upon subsequent exposure to said chosen soldering temperature, releases said fluxing agent to thereby enhance the solderability of said metallic surface.

2. A method as set forth in claim 1 wherein said dicarboxylic acid fluxing agent is selected from the group consisting of adipic acid, succinic acid, fumaric acid, maleic acid, glutaric acid, and their alkyl derivatives.

3. A method as set forth in claim 1 wherein said temperature is between about 120° C. and 140° C.

4. A method as set forth in claim 1 wherein said cellulose ester is selected from the group consisting of cellulose acetate, cellulose nitrate, cellulose acetate butyrate, and cellulose acetate propionate.

5. A method as set forth in claim 1 wherein said protective material is cellulose acetate butyrate and said fluxing agent is adipic acid.

6. A method as set forth in claim 5 wherein the relative ratio by weight of said cellulose acetate butyrate to said adipic acid is about 1:1.

7. A method as set forth in claim 1 wherein said mixture is prepared by the steps of:
   (a) dissolving said protective material in a first chosen solvent to form a protective material solution;
   (b) dissolving said fluxing agent in a second chosen solvent to form a fluxing agent solution; and
   (c) mixing said protective material solution with said fluxing agent solution to provide said mixture.

8. A method as set forth in claim 7 wherein said protective material comprises a cellulose ester and said protective material solvent comprises a material selected from the group consisting of acetone, methyl ethyl ketone, and tetrahydrofuran.

9. A method as set forth in claim 7 wherein said fluxing agent solvent comprises a material selected from the group consisting of methanol, isopropanol, and tetrahydrofuran.

10. A method as set forth in claim 7 wherein said protective material is cellulose acetate butyrate, said protective material solvent comprises acetone, said fluxing agent is adipic acid, and said fluxing agent solvent comprises isopropanol.

11. A method as set forth in claim 10 wherein the ratio by weight of said cellulose acetate butyrate to said adipic acid is about 1:1.

12. A method as set forth in claim 11 wherein said film has a thickness of less than or equal to 0.003 centimeter (0.001 inch).

13. A method as set forth in claim 1 wherein said mixture is prepared by the steps of:
   (a) heating said protective material and said fluxing agent to a temperature sufficient to melt said protective material and said fluxing agent and form a liquid mixture;
   (b) cooling said liquid mixture to room temperature to form a solidified mixture and dissolving said solidified mixture in a suitable solvent.

14. A method as set forth in claim 1 including the additional step of heating said film for a sufficient time and at a sufficient temperature to enhance the adherence of said film to said metallic substrate.

15. A film present on a metallic surface for protecting said metallic surface from contamination during storage prior to soldering and enhancing the solderability of said metallic surface, said film being formed by applying to said metallic surface a mixture comprising an unsubstituted or alkyl-substituted aliphatic dicarboxylic acid fluxing agent and a chosen protective material which is unreactive with said dicarboxylic acid and which forms with said dicarboxylic acid a film that alters when exposed to a chosen soldering temperature within the range of 260° to 371° C. to release said dicarboxylic acid, wherein said chosen protective material is selected from the group consisting of a cellulose ester, a vinyl chloride copolymer, an acrylic copolymer, and a polyether glycol.

16. A film according to claim 15 wherein said cellulose ester is selected from the group consisting of cellulose acetate, cellulose nitrate, cellulose acetate butyrate, and cellulose acetate propionate.

17. A film according to claim 15 wherein said fluxing agent is selected from the group consisting of adipic acid, succinic acid, fumaric acid, maleic acid, glutaric acid, and their alkyl derivatives.

18. A film according to claim 15 wherein said protective material is cellulose acetate butyrate and said fluxing agent is adipic acid.

19. A film according to claim 18 wherein the ratio by weight of said cellulose acetate butyrate to said adipic acid is about 1:1.

20. A film according to claim 15 wherein the formation of said film includes the additional step of heating said mixture after application on said metallic surface to a temperature of between about 120° C. to 150° C. to enhance the adherence of said film to said metallic surface.

21. A solution for application to a metallic surface to provide protection of said metallic surface from contamination during storage prior to soldering and enhanced solderability of said metallic surface, said solution comprising:
   a mixture of an unsubstituted or alkyl-substituted aliphatic dicarboxylic acid fluxing agent and a chosen protective material which is unreactive with said dicarboxylic acid and which forms with said dicarboxylic acid a film that alters when exposed to a chosen soldering temperature within the range of 260° to 371° C. to release said dicarboxylic acid, wherein said chosen protective material is selected from the group consisting of a cellulose ester, a vinyl chloride copolymer, an acrylic copolymer, and a polyether glycol.

22. A solution according to claim 21 wherein said cellulose ester is selected from the group consisting of cellulose acetate, cellulose nitrate, cellulose acetate butyrate, and cellulose acetate propionate.

23. A solution according to claim 21 wherein said fluxing agent is selected from the group consisting of adipic acid, succinic acid, fumaric acid, maleic acid, glutaric acid, and their alkyl derivatives.

24. A solution according to claim 21 wherein said protective material is cellulose acetate butyrate and said fluxing agent is adipic acid.

25. A solution according to claim 21 wherein the ratio by weight of said cellulose acetate butyrate to said adipic acid is about 1:1.

26. A solution according to claim 21 wherein said solvent is selected from the group consisting of acetate, methyl ethyl ketone, ethanol, isopropanol, tetrahydrofuran and mixtures thereof.

* * * * *

UNITED STATES PATENT AND TRADEMARK OFFICE
CERTIFICATE OF CORRECTION

PATENT NO. : 5,145,722
DATED : September 8, 1992
INVENTOR(S) : Alfred F. Kaspaul It is certified that error appears in the above-indentified patent and that said Letters Patent is hereby corrected as shown below:

Col. 9, line 42, delete "1" and insert therefor --14--.

Col. 12, line 12, delete "acetate" and insert therefor --acetone--.

Signed and Sealed this

Sixteenth Day of November, 1993

Attest:

BRUCE LEHMAN

Attesting Officer    Commissioner of Patents and Trademarks